United States Patent [19]
Hoffman et al.

[11] 3,963,993
[45] June 15, 1976

[54] POWER AMPLIFIER USING A PLURALITY OF PARALLEL CONNECTED AMPLIFIER ELEMENTS AND HAVING BURN-OUT PROTECTION

[75] Inventors: Gary R. Hoffman, Baltimore; William P. Rinkers, Baltimore, both of Md.

[73] Assignee: The Bendix Corporation, Southfield, Mich.

[22] Filed: Jan. 31, 1975

[21] Appl. No.: 546,153

[52] U.S. Cl. .......................... 330/124 R; 330/30 R; 330/124 D; 330/207 P; 357/40
[51] Int. Cl.² ............................................. H03F 3/68
[58] Field of Search .......... 330/30 R, 124 R, 124 D, 330/149, 207 P

[56] References Cited
UNITED STATES PATENTS
3,873,936  3/1975  Cho ................................ 330/149 X

*Primary Examiner*—R. V. Rolinec
*Assistant Examiner*—Lawrence J. Dahl
*Attorney, Agent, or Firm*—W. G. Christoforo; Bruce L. Lamb

[57] ABSTRACT

A power amplifier includes a plurality of generally identical amplifier elements connected in parallel between input and output transmission lines for phase coherent addition of the signal outputs of each amplifier element. Resistive elements are connected across normally phase identical points on the transmission lines. If the amplifier becomes electrically unbalanced, power is absorbed in the resistive elements, thus protecting the amplifier elements.

24 Claims, 6 Drawing Figures

POWER AMPLIFIER USING A PLURALITY OF PARALLEL CONNECTED AMPLIFIER ELEMENTS AND HAVING BURN-OUT PROTECTION

BACKGROUND OF THE INVENTION

This invention relates to apparatus for providing high power amplification, usually at relatively high or microwave frequencies, through the use of a plurality of generally identical parallel connected amplifier elements. The invention particularly relates to such apparatus which provides a high degree of burn-out protection of the amplifier elements if the apparatus should become electrically unbalanced.

A number of different techniques for providing high power amplifiers for relatively high frequency signals are known which overcome the power limitations imposed by individual solid state amplifier elements. These techniques have commonly provided for parallel connection of a plurality of solid state amplifier elements, with each amplifier element sharing a portion of the amplification task, close to the limits of its capability. The total power output obtainable with such an amplifier is thus theoretically equal to the product of the number of amplifier elements used and the power output of a single element. An example of such a power amplifier is described in U.S. Pat. No. 3,593,174. Briefly, that patent describes a solid state apparatus for amplifying signals in the microwave frequency range and which comprises a plurality of parallel connected, solid state amplifier elements, connected at equally spaced distances between tapered input and output transmission lines which, respectively, distribute microwave power equally to each of the parallel connected amplifier elements and provide for phase coherent addition of the signal outputs from each of the amplifier elements. Using this technique of phase coherent addition of the signal outputs of the plurality of the amplifier elements allows each amplifier element, under normal conditions, i.e., when the device is in electrical balance, to assume its proportionate share of the amplification task. However, under unbalanced electrical conditions such as might be caused by an unfavorable voltage standing wave ratio (VSWR) condition on the output side of the amplifier or, as another example, upon initial calibration or trimming of the amplifier before it is brought into electrical balance, the amplification task is distributed unequally among the various amplifier elements with the result that certain elements can become overloaded. One method of protecting the individual elements in the case of an electrically unbalanced condition is to provide more amplifying elements than might otherwise be required so that each is operating well below it rating during normal operation. In case of electrical unbalance no amplifying element would then be subjected to potentially catastrophic overload. Another means of protecting the amplifier elements comprises a circulator connected between the amplifier output terminal and the load to exclude load reflected power from the amplifier.

SUMMARY OF THE INVENTION

The present invention is an improvement over the prior art in that it permits each amplifier element to be operated under normal conditions approximately at its rated capability. In other words, under the teachings of this invention the individual elements need not be derated in order to provide protection against overload and catastrophic failure in the case of an unbalanced condition nor are auxiliary devices such as circulators required. The invention makes use of the prior art in that signals are amplified by distributing the input power equally among a plurality of parallel connected amplifier elements and providing for the coherent or inphase addition of the output power of the various amplifier elements. Specifically, the signal to be amplified is divided into N coherent signals, usually of equal power with one another, and applied respectively to N different input transmission lines, each having a different length or phase shift with respect to signals traversing therethrough, where N is the number of amplifier elements used. Resistive loads are connected across the various input transmission lines and output transmission lines, and in particular across points on the various lines at which signals traversing the transmission lines are normally in phase. Thus, under normal conditions since each end of each resistive element is at the same instantaneous voltage level, no current flows in the resistive elements and no power is dissipated therein. However, in an electrically unbalanced condition, such as, for example, when the amplifier output is subjected to a load having a high VSWR, the otherwise normal phasal relationships through the amplifier are upset. The various ends of certain resistive elements assume different voltage levels causing current to flow in the resistive elements, thus dissipating in the resistive elements the power that would otherwise be and in the prior art devices is, dissipated in the amplifier elements, thus protecting these elements from catastrophic failure.

DESCRIPTION OF THE PREFERRED EMBODIMENT

Figure 1:
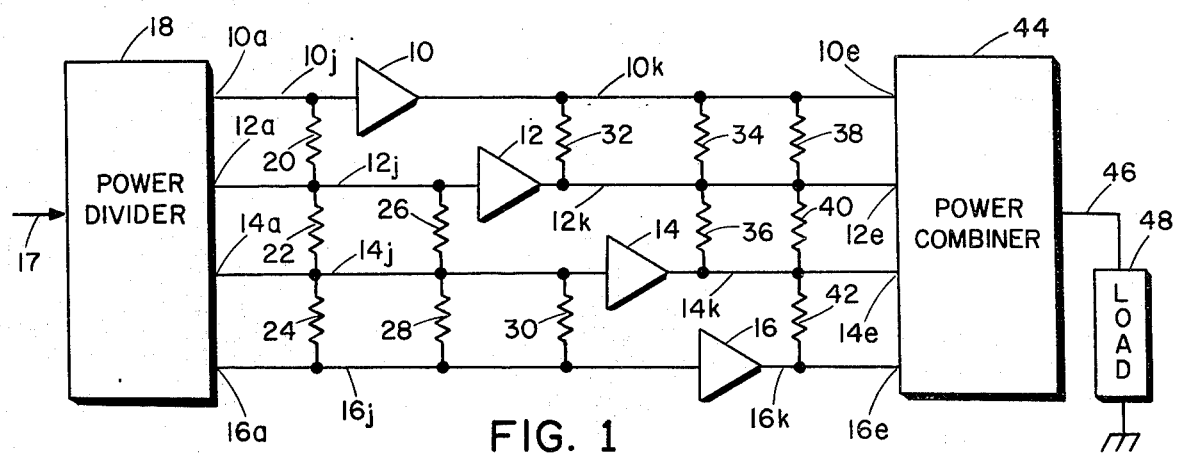
FIG. 1 is a simplified schematic which is helpful in explaining the theory of the invention.

Referring first to FIG. 1, there is seen an embodiment of the invention having four amplifier elements 10, 12, 14 and 16 arranged in parallel with one another. Although four amplifying elements are shown in this embodiment, it should be understood and will become clear to one skilled in the art as this description proceeds that any practical number of amplifying elements, odd or even, can be used in practicing the present invention. An input signal to be amplified is received at line 17 by a power divider 18 which distributes the power to the various amplifier elements. In this embodiment, the power is distributed equally to the various input transmission lines 10j, 12j, 14j and 16j of the respective amplifier elements at the input end of the various transmission lines, 10a, 12a, 14a and 16a. The amplifier elements feed various output transmission lines, these being output transmission lines 10k, 12k, 14k and 16k, respectively, with these transmission lines communicating at points 10e, 12e, 14e and 16e with a power combiner 44, wherein the power on the various output transmission lines is combined onto the single output transmission line 46, to be delivered to load 48.

Assuming normal balanced electrical conditions exist in the amplifier of FIG. 1, that is, that the signals at the outputs of power divider 18, at points 10a, 12a, 14a and 16a are in phase with one another, that the phase shifts of the various amplifier elements are the same and that signal power is equally distributed to the various input transmission lines, it can then be seen that signals traversing the various input transmission lines will be in phase with one another and of equal amplitude at points which are equally spaced, with respect to phase shift, from power divider 18. Resistive elements 20 to 42 are connected across such points of normally common phase and amplitude. In this case since there is no voltage drop across any resistive element, practically no current flows therein and no or negligible power is dissipated therein.

In a practical amplifier the phase shift per unit length is constant for the various transmission lines. Thus a resistive element is spaced so that its ends are equally spaced from power divider 18 and both ends are on either an input transmission line or an output transmission line. The last criterion assumes, as is usually the case, that the phase shift per unit length through an amplifier element is different from the phase shift per unit length through a transmission line.

It is desirable that the signals on the various transmission lines arrive at power combiner 44 in phase with one another and of equal amplitude. Under assumptions made above, this is accomplished by making the phase shift between power divider 18 and power combiner 44 the same along any one of the transmission lines. Of course, this is physically realized by making the distanes along the various transmission lines between the power divider and the power combiner equal. Power combiner 44 need thus be merely an impedance transformer to match the impedance of transmission lines 10k, 12k, 14k and 16k to line 46.

As previously mentioned, since each resistive element is connected across points which are in phase with respect to one another, no current normally flows therein and no power is normally dissipated. If, however, the circuit should become unbalanced as the result of, for example, a mismatching of the load 48 so that an excessive VSWR figure causes reflection of energy from the load, standing voltage waves will appear on the various transmission lines and the in phase relationship of the various points across which the resistive elements are connected will be disturbed. Current will thus flow in certain or all the resistive elements to dissipate the power that would otherwise be applied unequally to the various amplifier elements. This will be explained in greater detail below.

Figure 2:
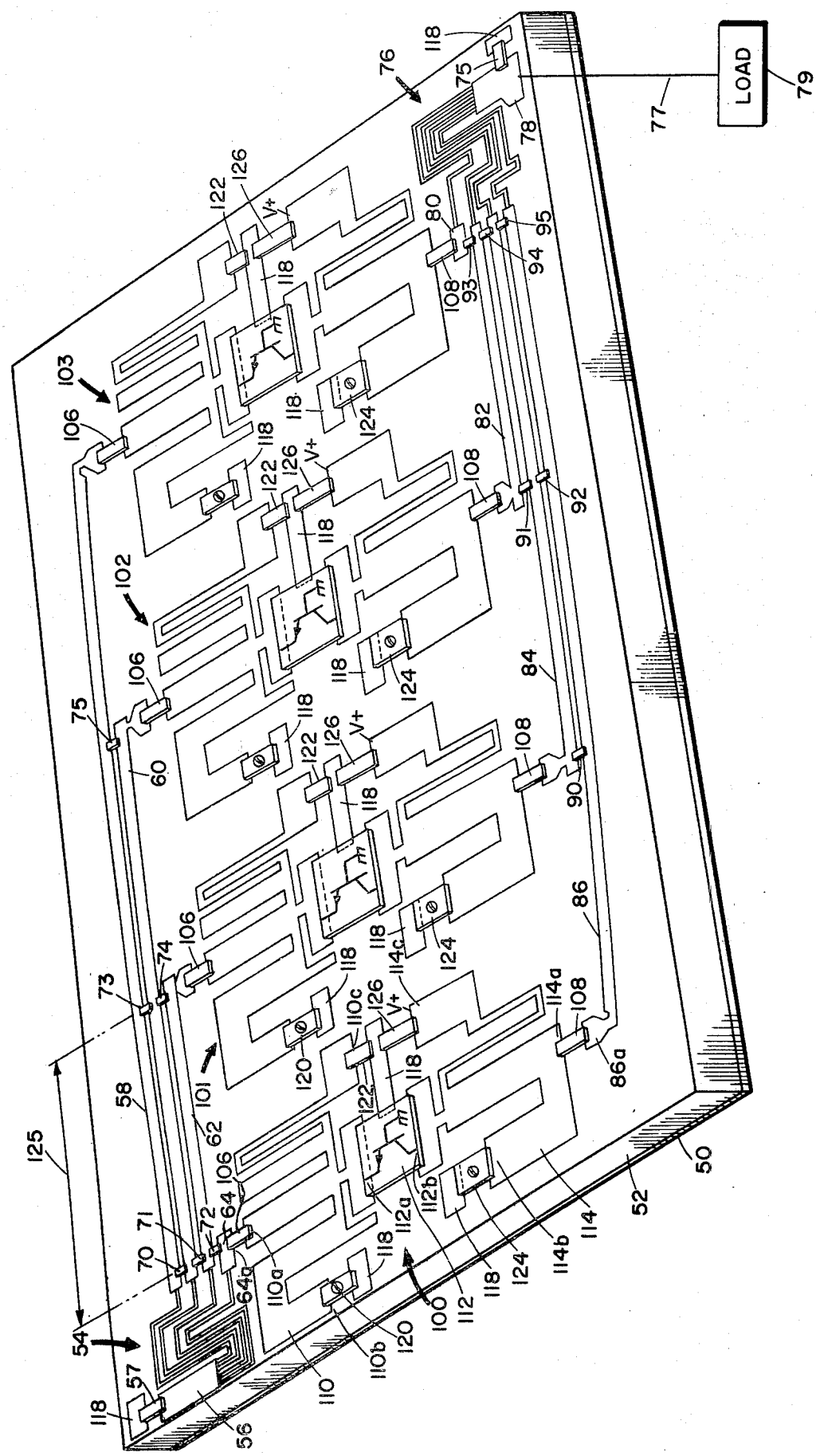
FIG. 2 is a modified perspective view of a solid state embodiment of the present invention.

Refer now to FIG. 2 which is a perspective view of an actual amplifier built in accordance with the principles of this invention. The present embodiment is constructed in accordance with microstrip techniques wherein conductive lands and tracks are positioned, usually by photoetching, on the top surface of a substrate 52 having a ground plane 50 on the other surface. As known to those skilled in the art, the substrate can be one of any number of dielectric materials such as, but not limited to, alumina or glass filled teflon. An input power divider 54 in the form of an impedance transformer receives an input signal to be amplified at land 56 and distributes the signal equally divided to the input transmission lines 58, 60, 62 and 64. The impedance transformer includes capacitor 57 and matches the impedance of the input signal to input transmission lines. Resistive elements 70 to 75 are connected between points on the various input transmission lines whereat the signals traversing the transmission lines are normally in phase with one another. In like manner, an output power combiner 76 in the form of another impedance transformer receives the amplified signals from output transmission lines 80, 82, 84 and 86 in phase and delivers them to land 78 for connection to a load 79 via line 77, both of which elements are shown schematically. Also in like manner, resistive elements 90 to 95 are connected across points on the output transmission lines whereat the signals traversing the output transmission lines are normally in phase. The last impedance transformer includes capacitor 75 and matches the impedance of the output transmission lines to line 77.

In this embodiment, four amplifier elements, 100 to 103, are shown connected parallel to one another. Generally, the amplifier elements are identical to one another so that the description will be confined to element 100. Amplifier element 100 is capacitively coupled to input transmission line 64 at portion 64a thereof and to output transmission line 86 at portion 86a thereof by capacitors 106 and 108, respectively. The other amplifier elements are similarly capacitively coupled to their associated input and output transmission lines by their associated coupling capacitors. The coupling capacitors including capacitors 106 and 108 are discreet components, capacitor 106 being suitably electrically connected between point 64a and point 110a on track 110 which comprises an input impedance transformer which transforms from the impedance of the input transmission line 64 to the input port 112a of amplifying device 112. Amplifying device 112 in this embodiment suitably comprises an NPN transistor whose emitter-electrode comprises input port 112a and whose collector electrode comprises an output port 112b. The base electrode is connected to a land 118 which in this embodiment is grounded. Capacitor 108 is also a discreet component electrically connected between point 86a on transmission line 86 and point 114a on track 114 which comprises an output impedance transformer which transforms the output impedance of port 112b to the impedance of transmission line 86. The input transformer additionally comprises a variable capacitor 120 which is used to tune the input impedance transformer and which is connected between point 110b on track 110 and ground. The input impedance transformer also includes resistor 122, which is a discreet component, connected between point 110c and ground. In like manner, the output impedance transformer includes an adjustable capacitor 124 used for tuning the output impedance transformer and connected between point 114b and ground. A source of bias potential (shown schematically) for amplifying element 112 is connected to point 114c on track 114 and includes a capacitor 126 connected between point 114c and ground to remove relatively high frequency signals therefrom. As previously noted, the invention has particular utility during the time the amplifier is in an electrically unbalanced condition, such as prior to the time that the input and output impedance transformers are tuned by manipulation of capacitors 120 and 124. It will also be noted that the various transmission lines in this embodiment have a common width and hence are of identical impedance. In this particular embodiment, the impedance of the various transmission lines was 50 ohms. The frequency of the signal being amplified was 1090 Mhz. The electrical distance between the various amplifying elements along the various transmission lines, for example, electrical distance 125, was 45°.

Although the embodiment of FIG. 2 is constructed in accordance with microstrip techniques, it should be obvious to one skilled in the art that a similar and practically identical embodiment can be build in accordance with thick film techniques and/or triplate techniques.

In essence, the sum of the lengths of the input transmission line of any amplifier element and the length of the output transmission line for the same element is a constant. Stated differently, the phase shift of a signal traversing from input land 56 to output land 78 is the same, regardless of which transmission and amplifier element path the signal traverses. Preferably, under normal conditions the signals at the input ends of each input transmission line are in phase. This is so in the embodiment of FIG. 2, and the transmission lines and amplifier elements are so arranged in that figure that signals traversing the various transmission lines are in phase with respect to one another at all adjacent points along the lines. The resistive elements are positioned close to the junction of the amplifier elements and the transmission lines as shown for convenience and symmetry and equally spaced for reasons to be made clear below.

As well known to those skilled in the art, amplifier elements as well as transmission lines of the type illustrated can be constructed with practically identical phase shifts. This is done routinely as exemplified by the aforementioned U.S. Pat. No. 3,593,174.

Figure 3:
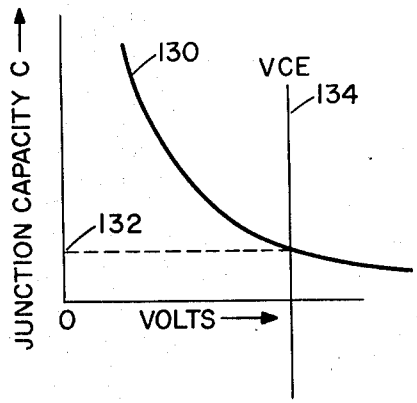
FIGS. 3 to 6 are various curves which aid in explaining the operation of the invention.
Figure 4:
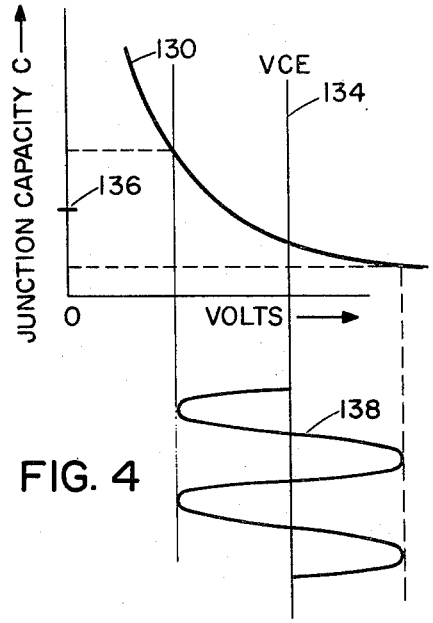
Figure 5:
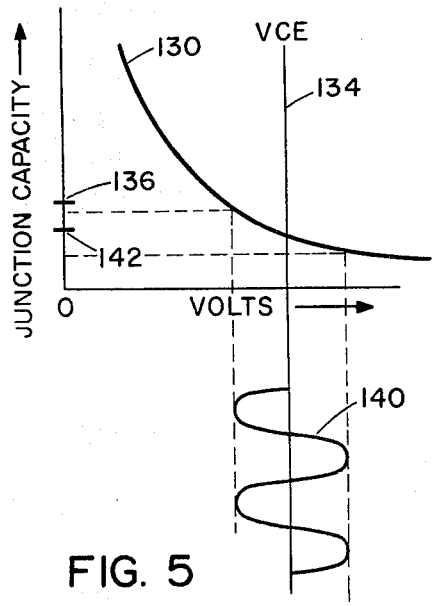
Figure 6:
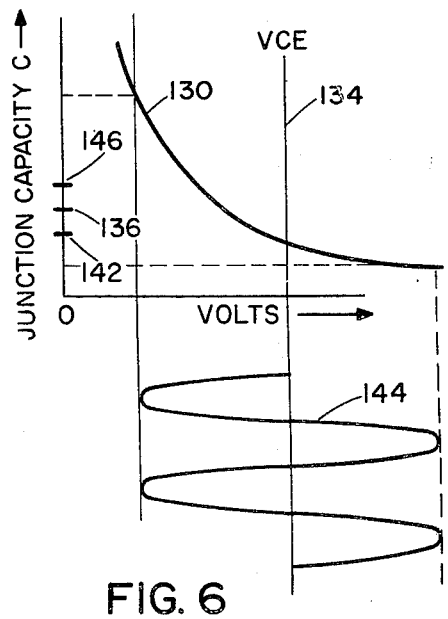

Assume now that the VSWR of the load attached to land 78 becomes large. In response thereto standing voltage waves appear at least along the output transmission lines with the result that power distribution to or contribution from the various amplifier elements becomes unequal. This may be considered as an unbalanced electrical condition of the amplifier. This inequality of power contribution is caused by an inequality of the amplitudes of the signal outputs of the various amplifier elements and, of course, by an inequality of the amplitudes of the signal inputs to the various amplifier elements. This leads to a change in the juntion capacity of the amplifier elements whereby the junction capacity of the various elements is no longer equal. This may be explained with reference to FIGS. 3 and 6 wherein the junction capacity of an amplifier element is plotted against signal voltage on that amplifier element. In the various figures, curve 130 is the capacity curve and vertical line 134 represents the collector to emitter bias voltage where a typical transistor comprises the active amplifying device. In FIG. 3, no signal voltage is impressed with the result that the junction capacity is found at the junction of curves 130 and 134, and more particularly at point 132. In FIG. 4, curve 138 represents a normal signal voltage, that is the signal voltage that results when there are no standing waves on the various transmission lines and power is equally distributed over the various amplifier elements. Under these circumstances, the junction capacity is represented at point 136. FIG. 5 shows a representation of a low amplitude signal represented by curve 140. In this case, the junction capacity is represented at point 142. Point 136 of FIG. 4 is seen produced in FIG. 5 for reference. FIG. 6 shows the large signal situation where curve 144 represents the large signal. In this case the junction capacity is represented at point 146. The normal junction capacity and the small signal capacity represented by points 136 and 142 is reproduced here for reference. It can be understood that with standing waves on the transmission lines the various amplifier elements operate in response to signal levels which are different with respect to the signal levels at which other of the amplifier elements are operating. As a result thereof the junction capacity of various of the amplifier elements will differ from the junction capacity of other of the amplifier elements. The amplifier as a whole will thus be in an electrical unbalanced condition with the result that either the phase of signals at the ends of various resistive elements will be different, or the amplitude of the signals on the opposite ends of the resistive elements will differ, or that both these phenomenon will occur with the result that current will flow in certain or all of the resistive elements resulting in a power dissipation therein. In this manner the various amplifier elements will be protected against an overload condition.

Other factors can lead to an unbalanced electrical amplifying condition. For example, during the time that the input and output impedance transformers 110 and 114 of the various amplifier elements are being tuned, it is possible that the power will be distributed unequally among the various amplifier elements. Here, too, the resistive loads will protect the amplifier elements from overload.

It should be understood that it is essential to the operation of the invention that the various amplifier elements be separated from one another by some electrical phase difference, which in the embodiment of FIG. 2 was chosen to be 45°. This may be more easily understood by considering the limiting condition wherein the various amplifier elements are operating exactly in phase with respect to ane another. In this case, an unfavorable VSWR condition will be reflected equally into each amplifier element with the result that no electrical unbalance will occur and no currents will flow in protective resistive elements so that all the amplifier elements will be overloaded. For a similar reason it is also desirable that the resistance elements be spaced apart.

It now should be obvious to one skilled in the art that the invention can be practiced in other forms than those specifically embodied in this disclosure. For example, the invention might be embodied using discreet transmission lines such as coaxial cables so long as the phasal relationship of the various signals traversing the transmission lines is in accordance with the present teachings and the various amplifier elements are separated in phase from one another as also taught herein. It should also be noted that the resistive elements on the input transmission lines present an improved load impedance to a driver amplifier (not shown) which feeds the amplifier of the invention in addition to the functions of these resistive elements already noted above. Where the system designer is not concerned about such an improved load impedance he might at his option omit the input transmission lines resistive elements and rely only on the resistive elements on the output transmission lines. Alternatively, the system designer might provide the resistive elements only on the input transmission lines and omit those on the output transmission lines as, for example, if he uses a circulator between the amplifier and the load or otherwise controls the load impedance. The invention thus is to be limited only by the true spirit and scope of the appended claims.

The invention claimed is:

1. An amplifier for amplifying a frequency signal comprising:
a plurality of amplifying elements for amplifying said frequency signal;
input means for receiving an input frequency signal to be amplified and for distributing the signal power of said input frequency signal in accordance with a predetermined arrangement to each of said amplifying elements for amplification thereby, said input means being comprised of a plurality of input tranmission lines, each having a first end for receiving a predetermined portion of the signal power of said input frequency signal and a second end for delivering said predetermined portion of the signal power of said input frequency signal to an associated one of said amplifying elements, each of said input transmission lines having a different phase delay between its first and second ends to signals traversing therethrough;
at least one means for resistively connecting a first point of a first of said input transmission lines with a second point of a second of said input transmission lines, said first and second points being arranged such that the signals traversing said first and second of said input transmission lines are normally in phase and of equal amplitude at said first and second points; and,
output means connected to receive the output of each of said amplifying elements for effecting phase coherent addition of the signal outputs of said amplifying elements.

2. An amplifier as recited in claim 1 wherein each of said amplifying elements comprises:
an active amplifying device having an input port and an output port;
an input impedance transformer means for connecting an associated one of said input transmission lines with said amplifying device; and,
an output impedance transformer means for connecting said output port with said output means.

3. The amplifier of claim 1 wherein said input transmission lines comprise a plurality of planar conductors, one for each said amplifying element and disposed in parallel, coplanor relationship with one another.

4. The amplifier of claim 3 wherein said first ends are generally aligned with one another, said input transmission lines being formed in steps of increasing lengths respectively.

5. The amplifier of claim 3 including a substrate of dielectric material having a first flat, plate-like surface, said conductors being disposed on said surface.

6. The amplifier of claim 5 including a planar ground plane formed on a surface of said dielectric material opposite said first surface.

7. The amplifier of claim 6 wherein said input transmission lines have a common impedance.

8. An amplifier for amplifying a frequency signal comprising:
a plurality of amplifying elements for amplifying said frequency signal;
input means for receiving an input frequency signal to be amplified and for distributing the signal power of said input frequency signal in accordance with a predetermined arrangement to each of said amplifying elements for amplification thereby;
output means connected to receive the output of each of said amplifying elements for effecting phase coherent addition of the signal outputs of said amplifying elements, said output means being comprised of a plurality of output transmission lines, each having a first end of receiving the signal output of an associated one of said amplifying elements, and a second end, each of said output transmission lines having a different phase delay between its first and second ends to the signals traversing therethrough; and,
at least one means for resistively connecting a first point of a first of said output transmission lines with a second point of a second of said output transmission lines, said first and second points being arranged such that the signals traversing said first and second of said output transmission lines are normally in phase and of equal amplitude at said first and second points.

9. An amplifier as recited in claim 8 wherein each of said amplifying elements comprises:
an active amplifying device having an input port and an output port;
input impedance transformer means for connecting said input means with said input port and,
output impedance transformer means for connecting said output port with an associated one of said output transmission lines.

10. The amplifier of claim 9 wherein said active amplifying device comprises a transistor.

11. The amplifier of claim 8 wherein said output transmission lines comprise a plurality of planar conductors, one for each said amplifying element and disposed in parallel, coplanar relationship with one another.

12. The amplifier of claim 11 wherein said second ends are generally aligned with one another, said output transmission lines being formed in steps of increasing lengths respectively.

13. The amplifier of claim 11 including a substrate of dielectric material having a first flat, plate-like surface, said conductors being disposed on said surface.

14. The amplifier of claim 13 including a planar ground plane formed on a surface of said dielectric material opposite said first surface.

15. The amplifier of claim 14 wherein said output transmission lines have a common impedance.

16. The amplifier of claim 8 wherein said output means includes an impedance transformer connected between said second ends and a common output terminal, the amplified signal being generated at said output terminal.

17. An amplifier for amplifying a frequency signal comprising:
a plurality of amplifying elements for amplifying said frequency signal;
input means for receiving an input frequency signal to be amplified and for distributing the signal power of said input frequency signal in accordance with a predetermined arrangement to each of said amplifying elements for amplification thereby, said input means being comprised of a plurality of input transmission lines, each having a first end for receiving a predetermined portion of the signal power of said input frequency signal and a second end for delivering said predetermined portion of signal power of said input frequency signal to an associated one of said amplifying elements, each of said input transmission lines having a different phase delay between its first and second ends to signals traversing therethrough;

at least one means for resistively connecting a first point of a first of said input transmission lines with a second point of a second of said input transmission lines, said first and second points being arranged such that the signals traversing said first and second of said input transmission lines are normally in phase and of equal amplitude at said first and second points;

output means connected to receive the output of each of said amplifying elements for effecting phase coherent addition of the signal outputs of said amplifying elements, said output means being comprised of a plurality of output transmission lines, each of said output transmission lines being associated with a different one of said amplifying elements, and each output transmission line having a first end connected to receive the output signal from its associated amplifying element, and a second end connected in common with the second ends of the other of said output transmission lines, the amplified frequency signal being generated at the common second ends, each of said output transmission lines having a different phase delay between its first and second ends to the signals traversing therethrough; and, at least a second means for resistively connecting a first point of a first of said output transmission lines with a second point of a second of said output transmission lines, said first and second points of said output transmission lines being arranged such that the signals traversing said first and second of said output transmission lines are normally in phase and of equal amplitude at said first and second points.

18. An amplifier as recited in claim 17 wherein each of said plurality of amplifying elements comprises:

an active amplifying device having an input port and an output port;

input impedance transformer means for connecting an associated one of said input transmission lines to said input port; and, output impedance transformer means for connecting said output port with an associated one of said output transmission lines.

19. The amplifier of claim 17 wherein said input transmission lines comprise a first set of transmission lines and said output transmission lines comprise a second set of transmission lines, said transmission lines comprising a plurality of planar conductors, one of each set for each said amplifying element, the transmission lines of each said set being disposed in parallel, coplanar relationship with the other transmission lines of the set.

20. The amplifier of claim 19 wherein the first ends of said input transmission lines are generally aligned with each other, said input transmission lines being formed in steps of increasing lengths respectively, and wherein the second ends of said output transmission lines are generally aligned with each other, said output transmission lines being formed in steps of increasing lengths respectively.

21. The amplifier of claim 19 including a substrate of dielectric material having a first flat, plate-like surface, said conductors being disposed on said surface.

22. The amplifier of claim 21 including a planar ground plane formed on a surface of said dielectric material opposite said first surface.

23. The amplifier of claim 17 wherein said output means includes an impedance transformer connected between said second ends and a common output terminal, the amplified signal being generated at said output terminal.

24. The amplifier of claim 17 wherein the phase delay of a signal traversing from the first end of one of said input transmission lines through its associated amplifying element to the second end of its associated output transmission line is equal to the phase delay of a like signal traversing from the first end of any other of said input transmission lines through that line's associated amplifying element to the second end of that amplifying element's output transmission line.

* * * * *